United States Patent
Ye et al.

(10) Patent No.: US 9,553,520 B2
(45) Date of Patent: Jan. 24, 2017

(54) SWITCHING POWER SOURCE, METHOD AND CONTROL CHIP FOR CONTROLLING THE SAME

(71) Applicant: BYD COMPANY LIMITED, Shenzhen (CN)

(72) Inventors: Wenhui Ye, Shenzhen (CN); Xiaohua Yang, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 0 days.

(21) Appl. No.: 14/767,072

(22) PCT Filed: Mar. 4, 2014

(86) PCT No.: PCT/CN2014/072844
§ 371 (c)(1),
(2) Date: Aug. 11, 2015

(87) PCT Pub. No.: WO2014/135060
PCT Pub. Date: Sep. 12, 2014

(65) Prior Publication Data
US 2015/0381058 A1  Dec. 31, 2015

(30) Foreign Application Priority Data
Mar. 4, 2013  (CN) .......................... 2013 1 0068394

(51) Int. Cl.
*H02M 3/335* (2006.01)
*H02M 7/217* (2006.01)
(Continued)

(52) U.S. Cl.
CPC ....... *H02M 3/33523* (2013.01); *H02M 7/2176* (2013.01); *H02M 1/4258* (2013.01);
(Continued)

(58) Field of Classification Search
CPC .................................................... H02M 3/335
See application file for complete search history.

(56) References Cited

U.S. PATENT DOCUMENTS 7,136,292 B1 * 11/2006 Chan .................. H02M 1/36
363/21.09
8,018,743 B2 * 9/2011 Wang ................ H02M 3/33507
323/284
(Continued)

FOREIGN PATENT DOCUMENTS

CN 201409085 Y 2/2010
CN 102118148 A 7/2011
(Continued)

OTHER PUBLICATIONS

The World Intellectual Property Organization (WIPO) International Search Report for PCT/CN2014/072844 Jun. 11, 2014.

*Primary Examiner* — Emily P Pham
(74) *Attorney, Agent, or Firm* — Anova Law Group, PLLC (57) ABSTRACT

A switching power source, a method and a control chip for controlling the same are provided. The switching power source includes: a filtering and rectifying module, connected with an AC power source and configured to filter and rectify an alternating current outputted from the AC power source to obtain a direct current; a control module, connected with the filtering and rectifying module and configured to obtain an amplitude of the alternating current from the direct current, to adjust a frequency of a control signal according to the amplitude, in which the control module decreases the frequency of the control signal continuously or intermittently when the amplitude increases, and to output the control signal; and a primary constant current circuit, connected with the control module and the filtering and rectifying module respectively, and configured to receive the control signal and to output a constant current according to the control signal.

19 Claims, 6 Drawing Sheets

(51) Int. Cl.
  *H02M 1/42*  (2007.01)
  *H02M 1/00*  (2006.01)
  *H03K 3/0231*  (2006.01)

(52) U.S. Cl.
  CPC ... *H02M 2001/0054* (2013.01); *H03K 3/0231* (2013.01); *Y02B 70/126* (2013.01); *Y02B 70/1491* (2013.01)

(56) References Cited

U.S. PATENT DOCUMENTS

| | | | |
|---|---|---|---|
| 2010/0027299 A1 | 2/2010 | Fang | |
| 2010/0208500 A1* | 8/2010 | Yan | H02M 3/33523 363/21.12 |
| 2011/0096573 A1* | 4/2011 | Zhu | H02M 3/33523 363/21.17 |
| 2011/0317458 A1 | 12/2011 | Yang et al. | |
| 2013/0027985 A1 | 1/2013 | Wang et al. | |
| 2013/0148387 A1* | 6/2013 | Ren | H02M 1/36 363/21.16 |
| 2014/0153297 A1 | 6/2014 | Balakrishnan et al. | |

FOREIGN PATENT DOCUMENTS

| | | |
|---|---|---|
| CN | 102310245 A | 1/2012 |
| CN | 102315787 A | 1/2012 |
| CN | 102386779 A | 3/2012 |
| CN | 102548103 A | 7/2012 |
| CN | 102904448 A | 1/2013 |
| JP | 2002051558 A | 2/2002 |
| JP | 2005031237 A | 2/2005 |
| KR | 20110078473 A | 7/2011 |

* cited by examiner

SWITCHING POWER SOURCE, METHOD AND CONTROL CHIP FOR CONTROLLING THE SAME

CROSS REFERENCE TO RELATED APPLICATION

This application is a national phase entry under 35 U.S.C. §371 of International Application No. PCT/CN2014/072844, filed on Mar. 4, 2014, which claims priority to, and benefits of Chinese Patent Application Serial No. 201310068394.X, filed with the State Intellectual Property Office of P. R. C., on Mar. 4, 2013, the entire content of all of which is incorporated herein by reference.

FIELD

Embodiments of the present disclosure generally relate to an electronic field, and more particularly, to a switching power source, a method for controlling the switching power source and a control chip for controlling the switching power source.

BACKGROUND

Currently, size of a flyback switching power source is mainly determined by size of the transformer and the input filtering capacitor in the power source, and a typical small switching power source adopts a relatively high switching frequency and a relatively low primary peak current, in which the relatively high switching frequency can ensure that the transformer has a relatively high power density, and the relatively low primary peak current can ensure that core saturation does not occur when a transformer having a small core area is used.

Figure 1:
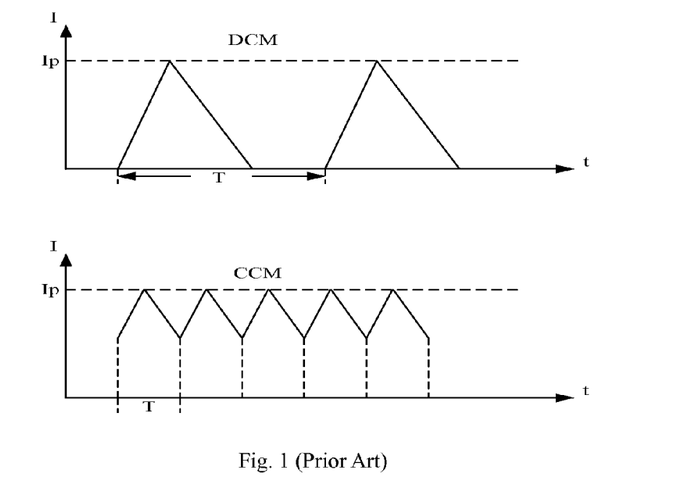
FIG. 1 is a schematic diagram illustrating output current of a flyback switching power source in the related art in a DCM mode and a CCM mode.

Currently, most flyback switching power sources work in a DCM (Discontinuous Inductor Current) mode, i.e., next charging is started only when a primary inductor is charged fully, as shown in FIG. 1, in which $I_P$ is the primary peak current and T is an operational period of the system. In order to ensure that the switching power source is working in the DCM mode and has an appropriate magnetic flux density, the inductance should be relatively small in high frequency applications. Thus, such a small switching power source generally has following defects:

1. The inductance is small, and a relatively large air gap exists between magnetic cores (in a condition of small core area), thus causing a large iron loss and being unfavorable for transformer manufacturing.

2. When a high alternating current is inputted, the high switching frequency causes a substantial switching loss, which greatly influences the efficiency of the switching power source.

SUMMARY

Embodiments of the present disclosure seek to solve at least one of the problems existing in the prior art, more particularly to provide a switching power source and a method and a control chip for controlling the switching power source.

To achieve the above objective, according to embodiments of a first aspect of the present disclosure, a switching power source is provided. The switching power source comprises: a filtering and a rectifying module, connected with an AC (alternating current) power source and configured to filter an alternating current outputted from the AC power source to obtain a filtered alternating current and to rectify the filtered alternating current into a direct current; a control module, connected with the filtering and rectifying module and configured to obtain an amplitude of the alternating current from the direct current, to adjust a frequency of a control signal according to the amplitude of the alternating current, in which the control module decreases the frequency of the control signal continuously or intermittently when the amplitude of the alternating current increases, and to output the control signal; and a primary constant current circuit, connected with the control module and the filtering and rectifying module respectively, and configured to receive the control signal and to output a constant current according to the control signal.

According to embodiments of the present disclosure, the operational frequency of the switching power source changes in inverse proportion to the amplitude of the alternating current. When the amplitude of the input alternating current is low, the operational frequency of the switching power source is relatively high, and the switching power source works in a CCM (Continuous Inductor Current) mode, thus obtaining a smaller primary charging or discharging current and a higher operational frequency. Thus, even when a transformer with a small core area is used, an output power of such a transformer can be equal to that of a transformer with a large core area and the transformer can be ensured not to enter a saturation state. Furthermore, an inductance is relatively high, thus ensuring that an air gap between magnetic cores is not too large to cause a serious core loss. When the amplitude of the input alternating current is high, the operational frequency of the switching power source is relatively low, and the switching power source quits the CCM mode, thus reducing the loss of the system.

In some embodiments of the present disclosure, the primary constant current circuit comprises: a main switching transistor, connected with the control module, in which the main switching power source is turned on or off by the control signal; a primary winding, connected with the main switching transistor and the filtering and rectifying module respectively, and configured to convert the direct current into an electromagnetic signal; a secondary winding, configured to output a constant current according to the electromagnetic signal generated by the primary winding; and a feedback winding, connected with the control module and the filtering and rectifying module respectively, and configured to transmit the amplitude of the alternating current to the control module.

According to embodiments of the present disclosure, the primary constant current circuit is controlled to turn on or off by the control signal and to output a constant current according to the control signal. The operational frequency of the primary constant current circuit changes in inverse proportion to the amplitude of the alternating current. When the amplitude of the input alternating current is low, the operational frequency is high, thus obtaining the smaller primary discharging or charging current, increasing the output power and ensuring that the transformer does not enter the saturation state. Furthermore, the inductance is relatively high, thus ensuring that the air gap between magnetic cores is not too large to cause a serious iron loss. When the amplitude of the input alternating current is high, the operational frequency is decreased, thus reducing the loss of the system.

To achieve the above objective, according to embodiments of a second aspect of the present disclosure, a control chip for controlling a power switching source is provide.

The switching power source comprises a filtering and rectifying module and a primary constant current circuit, the filtering and rectifying module is connected with an AC power source and configured to filter an alternating current outputted from the AC power source to obtain a filtered alternating current and to rectify the filtered alternating current into a direct current, the primary constant current circuit is connected with the filtering and rectifying module. The control chip comprises: a negative compensating module, connected with the primary constant current circuit and the filtering and rectifying module respectively, and configured to obtain an amplitude of the alternating current from the direct current, and to generate a continuously changing negative compensating current according to the amplitude of the alternating current, in which an amplitude of the negative compensating current is positively correlated with the amplitude of the alternating current; and a first oscillator module, connected with the negative compensating module, and configured to receive the negative compensating current outputted from the negative compensating module and to output a pulse signal according to the negative compensating current.

In some embodiments of the present disclosure, the negative compensating module comprises a first mirror current source and a first switching transistor, a first output end of the first mirror current source is connected with the first switching transistor, a gate of the first switching transistor is connected with a reference voltage, a source or a drain of the first switching transistor is connected with the feedback winding, and the negative compensating current is output to the first oscillator module from a second output end of the first mirror current source when the first switching transistor is turned on. The switching transistor in the present disclosure means the MOS (Metal-Oxide-Semiconductor) transistor.

In some embodiments of the present disclosure, the first oscillator module comprises a reference current source, a first capacitor, a first charging circuit, a first discharging circuit, a first charging switching transistor, a first discharging switching transistor and a first trigger, the first capacitor is connected with the reference current source and the negative compensating module respectively via the first charging circuit, the first capacitor is grounded via the first discharging circuit, the first trigger is connected with the first capacitor, the first charging switching transistor is configured to control the first charging circuit to turn on or off, the first discharging switching transistor is configured to control the first discharging circuit to turn on or off, a discharging or charging current of the first capacitor changes with a difference between the reference current and the negative compensating current, and the first trigger is configured to output the pulse signal with a frequency corresponding to the discharging or charging current of the first capacitor, in which the discharging and charging current of the first capacitor is negatively correlated with the negative compensating current.

With the control chip according to embodiments of the present disclosure, by providing the negative compensating module and the first oscillator module, the operational frequency of the switching power source can be decreased continuously when the amplitude of the alternating current increases. When the amplitude of the input alternating current is low, the operational frequency is high, thus obtaining the smaller primary discharging or charging current, increasing the output power and ensuring that the transformer does not enter the saturation state. Furthermore, the inductance is relatively high, thus ensuring that the air gap between magnetic cores is not too large to cause a serious iron loss. When the amplitude of the input alternating current is high, the operational frequency is decreased, thus reducing the loss of the system.

To achieve the above objective, according to embodiments of a third aspect of the present disclosure, another control chip for controlling the switching power source is provided. The control chip comprises: a line voltage detecting unit, connected with the filtering and rectifying module, and configured to receive a direct current comprising the amplitude of the alternating current, and to generate a positively correlated binary signal according to the amplitude of the alternating current; a decoding module, configured to decode the binary signal to form a negatively correlated and intermittently changing control current and to output the control current; and a second oscillator module, configured to receive the control current and to output a pulse signal according to the control current.

In some embodiments of the present disclosure, the line voltage detecting module comprises N comparators, a positive terminal of each comparator is connected with the filtering and rectifying module, a negative terminal of an $m^{th}$ comparator is connected with an $m^{th}$ reference voltage, the $m^{th}$ reference voltage decreases or increases gradually with an increment of m, an output level of each comparator changes with the amplitude of the alternating current so as to generate a N-bit binary signal, in which an amplitude of the binary signal is positively correlated with the amplitude of the alternating current, N is a positive integer larger than 2, and $1 \leq m \leq N$.

In some embodiment of the present disclosure, the decoding module comprises a second mirror current source, N transistors connected in parallel, a first current source and N second current sources, a first output end of the second mirror current source is connected in parallel with the N transistors, a control terminal of an $m^{th}$ transistor is connected with an output terminal of the $m^{th}$ comparator, a drain of each transistor is connected with the first current source, and a source or a drain of the $m^{th}$ transistor is grounded via an $m^{th}$ second current source, the N transistors are turned on or off under a control of the N-bit binary signal, a first output end of the second mirror current source outputs a current negatively correlated with the N-bit binary signal, and a second output end of the second mirror current source outputs a control current to the second oscillator unit, in which the current outputted from the first output end of the second mirror current source is the same as the control current outputted from the second output end of the second mirror current source.

In some embodiment of the present disclosure, the second oscillator module comprises a second capacitor, a second charging circuit, a second discharging circuit, a second charging switching transistor, a second discharging switching transistor and a second trigger, the second capacitor is connected with the control current via the second charging circuit, the second capacitor is grounded via the second discharging circuit, the second trigger is connected with the second capacitor, the second charging switching transistor is configured to control the second charging circuit to turn on or off, the second discharging switching transistor is configured to control the second discharging circuit to turn on or off, a discharging or charging current of the second capacitor changes with the control current, and the second trigger is configured to output a pulse signal with a frequency corresponding to the discharging or charging current of the second capacitor.

With the control chip according to other embodiments of the present disclosure, by providing the line voltage detecting module, the decoding module and the second oscillator module, the operational frequency of the switching power source can be decreased intermittently when the amplitude of the input alternating current increases. When the amplitude of the input alternating current is low, the operational frequency is high, thus obtaining the smaller primary discharging or charging current, increasing the output power and ensuring that the transformer does not enter the saturation state. Furthermore, the inductance is relatively high, thus ensuring that the air gap between magnetic cores is not too large to cause a serious iron loss. When the amplitude of the input alternating current is high, the operational frequency is decreased, thus reducing the loss of the system.

To achieve the above objective, according to embodiments of a fourth aspect of the present disclosure, a method for controlling a switching power source is provided. The switching power source comprises: a filtering and rectifying module, connected with an AC power source and configured to filter an alternating current outputted from the AC power source to obtain a filtered alternating current and to rectify the filtered alternating current into a direct current; and a primary constant current circuit, connected with the filtering and rectifying module. The method comprises: powering on the switching power source; obtaining an amplitude of the alternating current from the direct current; adjusting a frequency of a control signal according to the amplitude of the alternating current and outputting the control signal, in which the frequency of the control signal decreases continuously or intermittently when the amplitude of the alternating current increases; and controlling the primary constant current circuit to output a constant current according to the control signal.

In one embodiment, adjusting a frequency of a control signal according to the amplitude of the alternating current comprises: generating a continuously changing negative compensating current according to the amplitude of the alternating current; generating a discharging or charging current negatively correlated with the negative compensating current; and outputting a pulse signal with a frequency corresponding to the discharging or charging current.

In another embodiment, adjusting a frequency of a control signal according to the amplitude of the alternating current comprises: generating a positively correlated binary signal according to the amplitude of the alternating current; decoding the binary signal to form a negatively correlated and intermittently changing control current; generating a discharging or charging current changing with the control current; and outputting a pulse signal with a frequency corresponding to the discharging or charging current.

With the method for controlling the switching power source according to embodiments of the present disclosure, the operational frequency of the switching power source can be decreased continuously or intermittently when the amplitude of the input alternating current increases. Thus, the switching power source can be applied to both analog circuits and digital circuits.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Reference will be made in detail to embodiments of the present disclosure. The same or similar elements and the elements having same or similar functions are denoted by like reference numerals throughout the descriptions. The embodiments described herein with reference to drawings are explanatory, illustrative, and used to generally understand the present disclosure. The embodiments shall not be construed to limit the present disclosure.

In the specification, unless specified or limited otherwise, relative terms such as "central", "longitudinal", "lateral", "front", "rear", "right", "left", "inner", "encasing", "lower", "upper", "horizontal", "vertical", "above", "below", "up", "top", "bottom" as well as derivative thereof (e.g., "horizontally", "downwardly", "upwardly", etc.) may be construed to refer to the orientation as then described or as shown in the drawings under discussion. These relative terms are for convenience of description and do not require that the present disclosure be constructed or operated in a particular orientation.

In the description of the present disclosure, unless specified or limited otherwise, it should be noted that, terms "mounted," "connected" "coupled" and "fastened" may be understood broadly, such as permanent connection or detachable connection, electronic connection or mechanical connection, direct connection or indirect connection via intermediary, inner communication or interaction between two elements. These having ordinary skill in the art should understand the specific meanings in the present disclosure according to specific situations.

Figure 2:
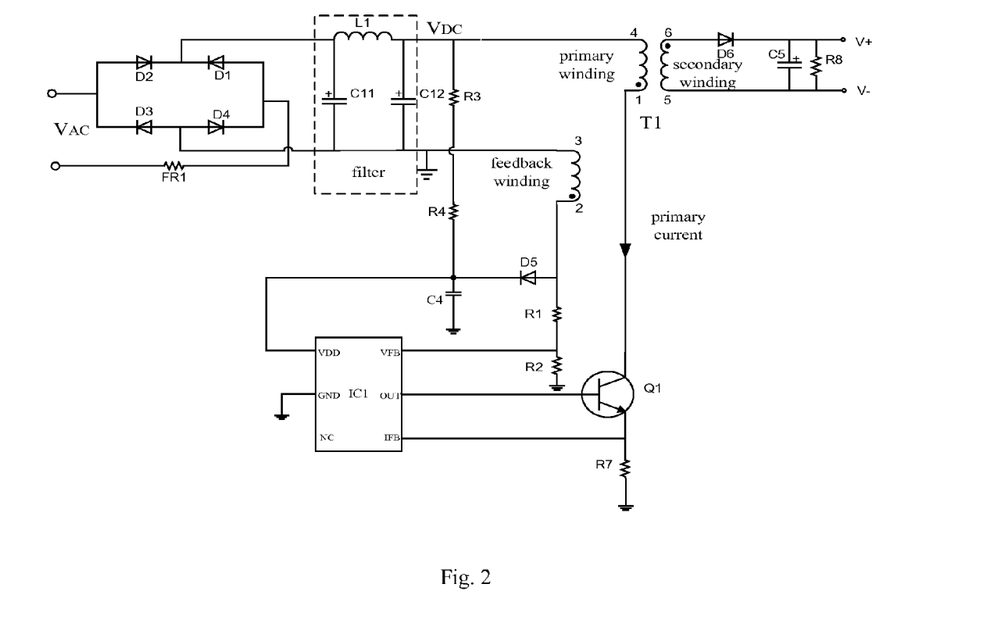
FIG. 2 is a schematic diagram of a switching power source according to an embodiment of the present disclosure.

In embodiments of the present disclosure, a switching power source is provided. As shown in FIG. 2, the switching power source includes a filtering and rectifying module, a control module and a primary constant current circuit. The filtering and rectifying module is connected with an AC power source and configured to filter an alternating current outputted from the AC power source to obtain a filtered alternating current and to rectify the filtered alternating current into a direct current. The control module is connected with the filtering and rectifying module and configured to obtain an amplitude of the alternating current from the direct current, to adjust a frequency of a control signal according to the amplitude of the alternating current, and to output the control signal. The primary constant current circuit is connected with the filtering and rectifying module and the control module respectively, and configured to receive the control signal and to output a constant current according to the control signal.

As shown in FIG. 2, in one embodiment, the filtering and rectifying module comprises a rectifying bridge and a filter connected with an output end of the rectifying bridge. The rectifying bridge consists of four diodes D1, D2, D3 and D4. The filter comprises a capacitor C11, a capacitor C12 connected in parallel with the capacitor C11 and an inductor L1 connected between a positive terminal of the capacitor C11 and a positive terminal of the capacitor C12. The primary constant current circuit comprises a primary winding, a main switching transistor Q1, a secondary winding and a feedback winding. One end of the primary winding is connected with filtering and rectifying module, and the other end of the primary winding is connected with the main switching transistor Q1. The main switching transistor Q1 is connected with a control signal output terminal OUT of the control module, and turned on or off by the control signal so as to realize a control for the primary winding. The primary winding is connected with the main switching transistor Q1 and the filtering and rectifying module respectively, and configured to convert the direct current into an electromagnetic signal under the control of the main switching transistor Q1. In some embodiments as shown in FIG. 2, the main switching transistor Q1 is a triode, a collector of the triode is connected with the primary winding, a base of the triode is connected with the control signal output terminal OUT of the control module, and an emitter of the triode is grounded via a resistor R7.

The secondary winding is configured to output the constant current according to the electromagnetic signal generated by the primary winding. When the main switching transistor Q1 is turned off, energy stored in the primary winding is transmitted to the secondary winding, and then consumed by a load circuit connected with the secondary winding. In some embodiments, as shown in FIG. 2, a first output end of the secondary winding is connected with a diode D6, and a resistor R8 and a capacitor C5 connected in parallel are connected between the diode D6 and a second output end of the secondary winding.

The feedback winding is connected with a feedback voltage detecting terminal VFB of the control module and the filtering and rectifying module respectively, and configured to transmit the amplitude of the alternating current to the control module. As shown in FIG. 2, a first end of the feedback winding is connected with the rectifying bridge and grounded, and a second end of the feedback winding is grounded via a resistor R1 and a resistor R2 connected in series. The feedback voltage detecting terminal VFB of the control module is connected with a node between the resistor R1 and the resistor R2. The second end of the feedback winding is also connected with a chip power source terminal VDD of the control module via a diode D5 to supply power for the control module.

In some embodiments, the control module may further comprise a mode control unit (not shown). The mode control unit adjusts an operational mode of the primary constant current circuit according to the frequency of the control signal. When the amplitude of the alternating current is low, the frequency of the control signal is high, and the mode control unit controls the primary constant current circuit to enter a CCM mode. When the amplitude of the alternating current is high, the frequency of the control signal is low, and the mode control unit controls the primary constant current circuit to enter a DCM mode. Thus, by controlling the switching power source to work in the CCM mode when the amplitude of the input alternating current is low, a lower primary charging or discharging current can be obtained, and by controlling the switching power source to work in the DCM mode when the amplitude of the input alternating current is high, a loss of the system can be reduced.

It should be noted that, the low or high amplitude of the alternating current refers to the generally known low or high amplitude in the related art, and the high or low frequency of the control signal is defined relatively rather than absolutely. In one preferred embodiment of the present disclosure, when the amplitude of the alternating current is higher than 120V, the frequency of the control signal is relatively high, and the mode control unit controls the primary constant current circuit to enter the CCM mode. When the amplitude of the alternating current is lower than 120V, the frequency of the control signal is relatively low, and the mode control unit controls the primary constant current circuit to enter the DCM mode.

Figures 3, 4:
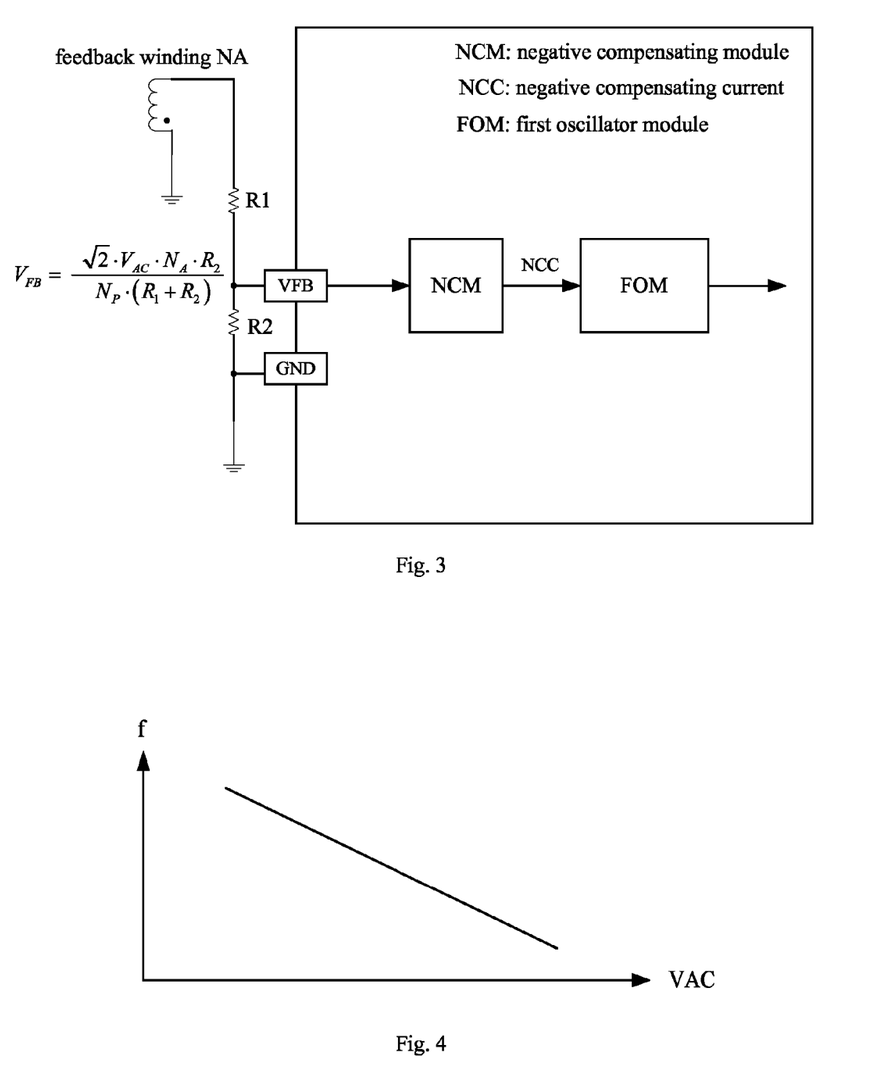
FIG. 3 is a schematic diagram of a control chip according to an embodiment of the present disclosure.
FIG. 4 is a schematic diagram illustrating a relationship between an operational frequency of a switching power source using the control chip shown in FIG. 3 and an amplitude of an input alternating current.
Figure 6:
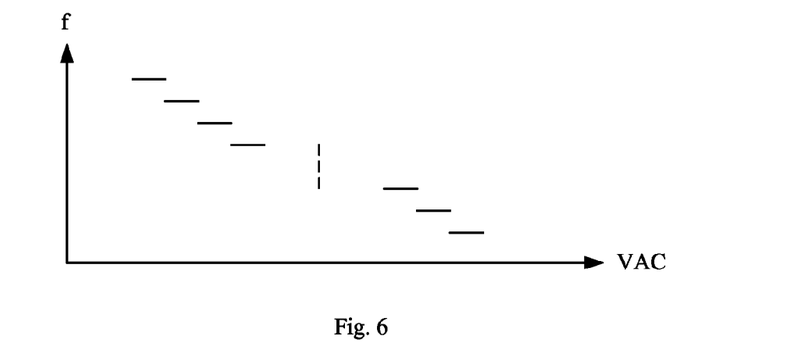
FIG. 6 is a schematic diagram illustrating a relationship between an operational frequency of a switching power source using the control chip shown in FIG. 5 and an amplitude of an input alternating current.

As shown in FIGS. 4 and 6, the operational frequency of the switching power source changes in inverse proportion to the amplitude of the input alternating current. When the alternating current with the low amplitude is inputted, the operational frequency of the switching power source is relatively high, and the switching power source works in the CCM mode so as to obtain a lower primary charging or discharging current. Thus, a transformer with a small core area can be used, and an output power of such a transformer can be equal to that of a transformer with a large core area and the transformer can be ensured not to enter a saturation state. Furthermore, an inductance of the transformer with the small core is relatively high, thus guaranteeing that an air gap between magnetic cores is not too large to cause a substantial core loss. When the alternating current with the high amplitude is input, the operational frequency of the switching power source decreases, and the switching power source quits the CCM mode, thus reducing the loss of the system.

A control chip is further provided according to embodiments of the present disclosure. In some embodiments of the present disclosure, pins of the control chip are described in the following table 1.

TABLE 1

| pins of the control chip | |
|---|---|
| Pin symbol | Name and function |
| VFB | feedback voltage detecting terminal, configured to detect the feedback voltage |
| OUT | control signal output terminal |
| GND | grounding terminal |
| IFB | primary current detecting terminal, configured to detect the primary current |
| VDD | chip power source terminal |

In one embodiment of the present disclosure, an analog adjustment to the operational frequency of the switching power source is realized according to the amplitude of the alternating current, i.e., the operational frequency of the switching power source decreases continuously as the amplitude of the alternating current increases. As shown in FIG. 3, in this embodiment, the control chip comprises a negative compensating module and a first oscillator module. An input end of the negative compensating module is connected between the resistor R1 and the resistor R2. After a voltage dividing by the resistor R1 and the resistor R2, the feedback winding transmits the amplitude of the alternating current to the negative compensating module, and the negative compensating module generates a continuously changing negative compensating current according to the amplitude of the alternating current. An amplitude of the negative compensating current is positively correlated with the amplitude of the alternating current. An input end of the first oscillator module is connected with an output end of the negative compensating module. The negative compensating module transmits the negative compensating current to the first oscillator module, and the first oscillator module outputs a pulse signal according to the negative compensating current.

The negative compensating module may comprise a first mirror current source and a first switching transistor. A first output end of the first mirror current source is connected with the first switching transistor, a gate of the first switching transistor is connected with a reference voltage, and a source or a drain of the first switching transistor is connected with the feedback winding. The negative compensating module transmits the amplitude of the alternating current to the feedback voltage detecting terminal VFB, and the first switching transistor is controlled to turn on or off according to a difference between the reference voltage and the voltage at the feedback voltage detecting terminal VFB. The negative compensating current is output to the first oscillator module from a second output end of the first mirror current source when the first switching transistor is turned on.

Figure 7:
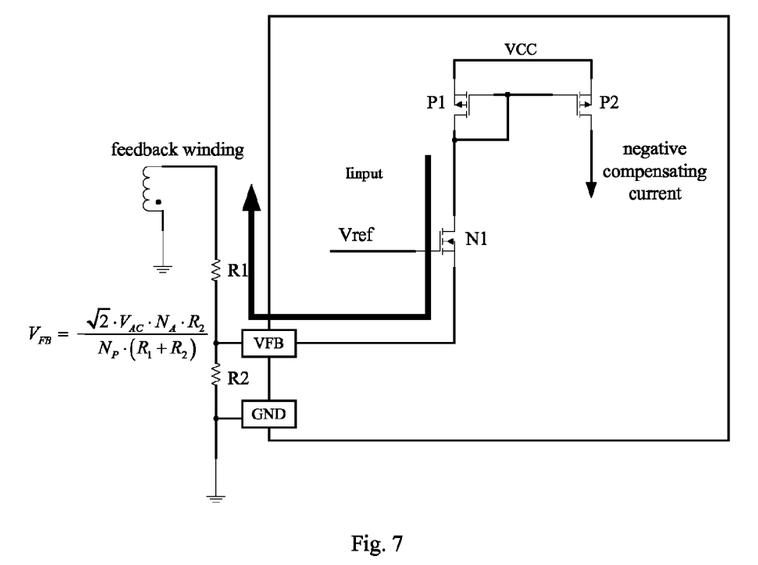
FIG. 7 is a circuit diagram of a negative compensating module of the control chip shown in FIG. 3.

As shown in FIG. 7, in some embodiments, the first mirror current source comprises a current source VCC, a PMOS transistor P1, and a PMOS transistor P2. The first output end of the first mirror current source is connected with a NMOS transistor N1 (i.e., the first switching transistor), a gate of the NMOS transistor N1 is connected with a reference voltage Vref, and a source of the NMOS transistor N1 is connected with the feedback winding via the feedback voltage detecting terminal VFB. When the main switching transistor Q1 is turned on, the amplitude $V_{AC}$ of the alternating current is coupled in equal proportion to the feedback voltage detecting terminal VFB of the control chip via the primary winding and the feedback winding. Specifically, the feedback voltage $V_{FB}$ is defined by $$V_{FB} = -\frac{\sqrt{2} \cdot V_{AC} \cdot N_A \cdot R_2}{N_P \cdot (R_1 + R_2)},$$

where $N_A$ is a number of turns in the feedback winding, $N_P$ is a number of turns in the primary winding. A difference between the reference voltage Vref and the feedback voltage $V_{FB}$ is a gate-source voltage $V_{GS}$ of the NMOS transistor N1, and the NMOS transistor N1 is turned on or off according to the gate-source voltage $V_{GS}$. When the NMOS transistor N1 is turned on, current is sunk into the feedback voltage detecting terminal VFB by the current source VCC. The higher the amplitude of the alternating current is, the higher the sink current is. For example, the sink current $I_{input}$ is defined by $$I_{input} = \frac{\sqrt{2} \cdot V_{AC} \cdot N_A}{N_P \cdot R_1}.$$

After performing an equal proportional mirror effect on the sink current $I_{input}$ by the PMOS transistor P and the PMOS transistor P2, the negative compensating current is generated. The amplitude of the negative compensating current is positively correlated with the amplitude of the alternating current.

Figure 8:
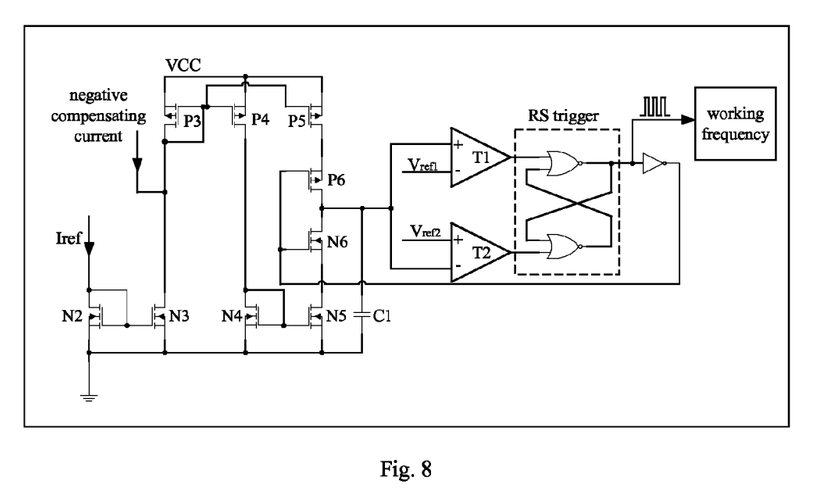
FIG. 8 is a circuit diagram of a first oscillator module of the control chip shown in FIG. 3.

The first oscillator module may comprise a reference current source, a first capacitor, a first charging circuit, a first discharging circuit, a first charging switching transistor, a first discharging switching transistor and a first trigger. The first capacitor is connected with the reference current source and the negative compensating module respectively via the first charging circuit, the first capacitor is grounded via the first discharging circuit, and the first trigger is connected with the first capacitor. The first charging switching transistor is configured to control the first charging circuit to turn on or off, and the first discharging switching transistor is configured to control the first discharging circuit to turn on or off. A discharging or charging current of the first capacitor changes with a difference between the reference current and the negative compensating current, and the first trigger is configured to output the pulse signal with a frequency corresponding to the discharging or charging current of the first capacitor. The discharging and charging current of the first capacitor is negatively correlated with the negative compensating current.

As shown in FIG. 8, the first oscillator module comprises a reference current source Iref, a capacitor C1, a first charging circuit, a first discharging circuit, a first charging switching transistor, a first discharging switching transistor and a first trigger. The first charging circuit comprises a PMOS transistor P3 and a PMOS transistor P5. The first discharging circuit comprises the PMOS transistor P3, a PMOS transistor P4, an NMOS transistor N4 and an NMOS transistor N5. A PMOS transistor P6 is configured as the first charging switching transistor. An NMOS transistor N6 is configured as the first discharging switching transistor. The capacitor C1 is connected with the reference current source Iref and the second output end of the negative compensating module respectively via the first charging circuit, and grounded via the first discharging circuit.

In some embodiments, the first oscillator module may further comprise a comparator T1 and a comparator T2. A positive terminal of the comparator T1 and a negative terminal of the comparator T2 are connected with the capacitor C1, a negative terminal of the comparator T1 is connected with a reference voltage $V_{ref1}$, and a positive terminal of the comparator T2 is connected with a reference voltage $V_{ref2}$. The reference voltage $V_{ref1}$ is larger than the reference voltage $V_{ref2}$, and each of the reference voltage $V_{ref1}$ and the reference voltage $V_{ref2}$ is a positive voltage. The first trigger is configured as an RS trigger with two input terminals. The two input terminals of the RS trigger are connected with an output terminal of the comparator T1 and an output terminal of the comparator T2 respectively, an output terminal of the RS trigger is connected with the PMOS transistor P6 and the NMOS transistor N6 respectively via an inverter so as to control the PMOS transistor P6 and the NMOS transistor N6 to turn on or off.

Referring to FIG. 8, after performing a proportional mirror effect on the reference current Iref by the NMOS transistor N2 and the NMOS transistor N3, a mirrored current is generated. The mirrored current and the negative compensating current are subtracted from each other to obtain a current, on which a mirror effect is performed by the PMOS transistor P3 and the PMOS transistor P5 to generate a charging current for charging the capacitor C1. When the control chip is just powered on, a voltage across the capacitor C1 is zero, a low level is outputted from the comparator T1, a high level is outputted from the comparator T2, a high level is outputted from the RS trigger consisting of two NOR gates and then turned over to a low level by the inverter, the PMOS transistor P6 is turned on, the NMOS transistor N6 is turned off, and a charging for the capacitor C1 is started. When the voltage across the capacitor C1 is larger than the reference voltage Van, a high level is outputted from the comparator T1, a low level is outputted from the RS trigger and then turned over to a high level by the inverter the PMOS transistor P6 is turned off, the NMOS transistor N6 is turned on, and a discharging for the capacitor C1 is started. The discharging current of the capacitor C1 is subtracted from the current mirrored by the PMOS transistor P3, the PMOS transistor P4, the NMOS transistor N4 and the NMOS transistor N5 so as to generate a current in the first discharging circuit. The discharging is stopped until the voltage across the capacitor C1 is less than the reference voltage $V_{ref2}$. The above processes are repeated, thus outputting a square-wave signal from the RS trigger. The discharging or charging current of the capacitor C1 can be changed by changing the negative compensating current, and then the frequency of the square wave outputted from the RS trigger can be changed.

With the control chip according to an embodiment of the present disclosure, by providing the negative compensating module and the first oscillator module described above, the operational frequency of the switching power source can be decreased continuously when the amplitude of the alternating current increases.

Figure 5:
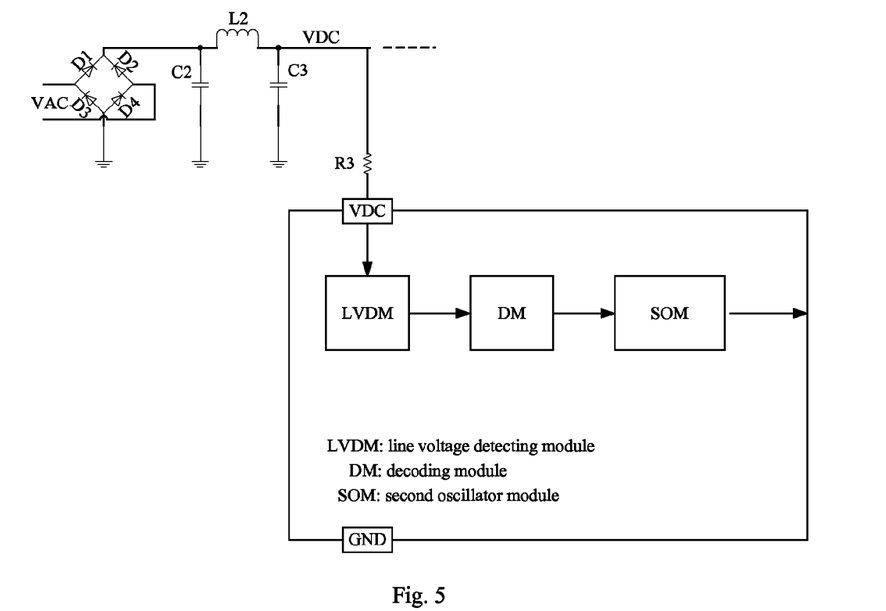
FIG. 5 is a schematic diagram of a control chip according to another embodiment of the present disclosure.

In another embodiment of the present disclosure, a digital adjustment to the operational frequency of the switching power source is realized according to the amplitude of the alternating current, i.e., the operational frequency of the switching power source decreases intermittently as the amplitude of the alternating current increases. As shown in FIG. 5, in this embodiment, the control chip comprises a line voltage detecting module, a decoding module and a second oscillator module. The line voltage detecting module is connected with the filtering and rectifying module, and configured to receive the direct current comprising the amplitude of the alternating current, and to generate a positively correlated binary signal according to the amplitude of the alternating current. The decoding module is connected with the line voltage detecting module and configured to decode the binary signal to form a negatively correlated and intermittently changing control current and to output the control current. The second oscillator module is connected with the decoding module and configured to receive the control current and to output a pulse signal according to the control current.

Figure 9:
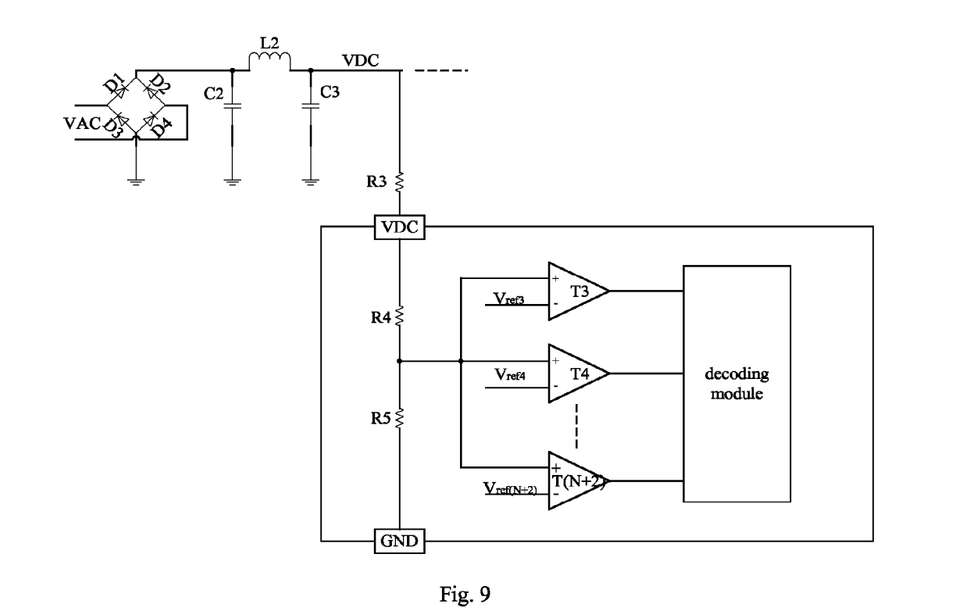
FIG. 9 is a circuit diagram of a line voltage detecting module of the control chip shown in FIG. 5.

FIG. 9 is a circuit diagram of a line voltage detecting module according to an embodiment of the present disclosure. As shown in FIG. 9, the input alternating voltage $V_{AC}$ is rectified into the direct line voltage $V_{DC}$ by the rectifying bridge, in which $V_{DC}=\sqrt{2}V_{AC}$. Then, a waveform of the line voltage is smoothened by a π filter consisting of a capacitor C2, a capacitor C3 and an inductor L2. A resistor R3 outside the control chip as well as a resistor R4 and a resistor R5 inside the control chip form a voltage divider for attenuating the line voltage proportionally to obtain a comparison voltage. The resistor R4 may also be grounded via a capacitor (not shown). The line voltage detecting module comprises N comparators T3, T4, . . . , T(N+2), in which N is a positive integer larger than 2. A positive terminal of each of the N comparators is connected with the filtering and rectifying module. In this embodiment, the positive terminal of each of the N comparators is connected with the comparison voltage. A negative terminal of an $m^{th}$ comparator is connected with an $m^{th}$ reference voltage, and the $m^{th}$ reference voltage decreases or increases gradually with an increment of m, in which 1≤m≤N. In one preferred embodiment of the present disclosure, the $N^{th}$ reference voltage>the $(N-1)^{th}$ reference voltage> . . . >the second reference voltage>the first reference voltage. The comparison voltage is compared with each of the N reference voltages respectively. When the comparison voltage is larger than the first reference voltage, the output level of the comparator T3 turns over to a high level. When the comparison voltage is larger than the $N^{th}$ reference voltage, all the output levels of the N comparators turn over to a high level. Finally, the amplitude information of the alternating current contained in the line voltage is stored in this parallel binary signal formed by the outputs of these N comparators. An amplitude of the binary signal is positively correlated with the amplitude of the alternating current. The line voltage detecting module transmits this binary signal to the decoding module for decoding. The output level of the $m^{th}$ comparator turns over when the line voltage is equal to the $m^{th}$ reference voltage, i.e., $$V_{DC} = \frac{\text{the } m^{th} \text{ reference voltage}}{R_5} \cdot (R_3 + R_4 + R_5).$$

Figure 10:
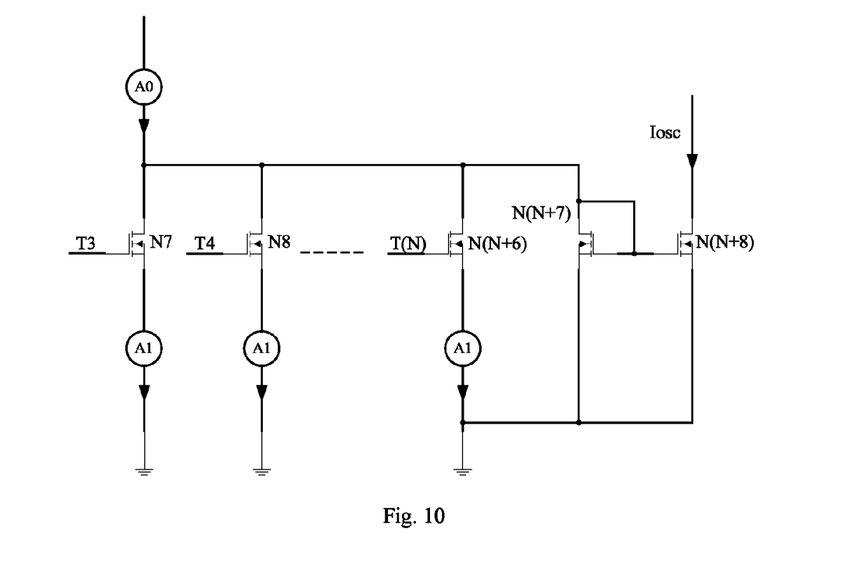
FIG. 10 is a circuit diagram of a decoding module of the control chip shown in FIG. 5.

FIG. 10 is a circuit diagram of a decoding module according to an embodiment of the present disclosure. As shown in FIG. 10, the decoding module comprises a second mirror current source, N transistors N7, N8, . . . , N(N+6) connected in parallel, a current source A0 and N current sources A1. The second mirror current source comprises an NMOS transistor N(N+7) and an NMOS transistor N(N+8). A first output end of the second mirror current source is connected with the N transistors. A control terminal of an $m^{th}$ transistor is connected with the output terminal of the $m^{th}$ comparator, a drain of each of the N transistors is connected with the current source A0, and a source of the $m^{th}$ transistor is grounded via an independent $m^{th}$ current source A1, in which A0>A1*N. The control signal for controlling the N transistors is the parallel binary signal outputted from the line voltage detecting module, and the output of one comparator is corresponding to one transistor. The N transistors are turned on or off under a control of the N-bit binary signal, and a first output end of the second mirror current source outputs a control current negatively correlated with the N-bit binary signal. The control current Iosc is generated by subtracting the current of the current source A0 from the current of the current source A1. When only the output level of the comparator T3 is a high level, the NMOS transistor N7 is turned on and other NMOS transistors are turned off, and the control current is Iosc=A0−A1*1. Similarly, when the output level of the comparator T(N) is a high level, all the NMOS transistors are turned on, and the control current is Iosc=A0−A1*N. Thus, the control current Iosc changes with the alternating voltage $V_{AC}$. The higher the alternating voltage VA is, the lower the control current Iosc is. Finally, the control current Iosc is transmitted to the second oscillator module for controlling the second oscillator module to generate different oscillation frequencies under different alternating voltages.

Figure 11:
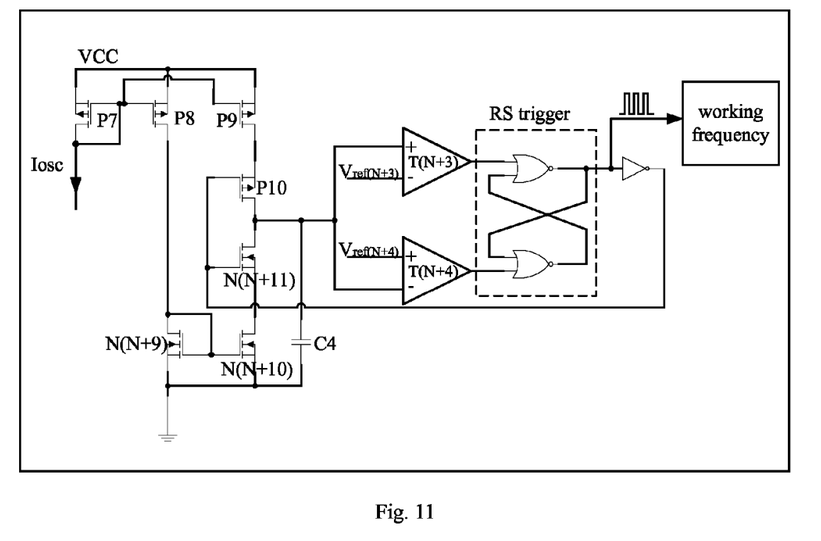
FIG. 11 is a circuit diagram of a second oscillator module of the control chip shown in FIG. 5.

FIG. 11 is a circuit diagram of a second oscillator module according to an embodiment of the present disclosure. As shown in FIG. 11, the second oscillator module comprises a capacitor C4, a second charging circuit, a second discharging circuit, a second charging switching transistor, a second discharging switching transistor and a second trigger. The second charging circuit comprises a PMOS transistor P7 and a PMOS transistor P9. The second discharging circuit comprises the PMOS transistor P7, a second PMOS transistor P8, a $(N+9)^{th}$ transistor PMOS transistor N(N+9) and a $(N+10)^{th}$ PMOS transistor N(N+10). The second charging switching transistor is a PMOS transistor P10, and the second discharging switching transistor is a $(N+11)^{th}$ PMOS transistor N(N+11). The capacitor C4 is connected with the control current via the second charging circuit, and grounded via the second discharging circuit. The second charging switching transistor is configured to control the second charging circuit to turn on or off, and the second discharging switching transistor is configured to control the second discharging circuit to turn on or off. Alternatively, the second oscillator module may further comprise a comparator T(N+3) and a comparator T(N+4). A positive terminal of the comparator T(N+3) and a negative terminal of the comparator T(N+4) are connected with the capacitor C4, a negative terminal of the comparator T(N+3) is connected with a reference voltage $V_{ref(N+3)}$, a positive terminal of the comparator T(N+4) is connected with a reference voltage $V_{ref(N+4)}$, the reference voltage $V_{ref(N+3)}$ is larger than the reference voltage $V_{ref(N+4)}$, and both of the reference voltage $V_{ref(N+3)}$ and the reference voltage $V_{ref(N+4)}$ are positive voltages. The second trigger is configured as an RS trigger having two input terminals. The two input terminal of the RS trigger are connected with an output terminal of the comparator T(N+3) and an output terminal of the comparator T(N+4) respectively, an output terminal of the RS trigger is connected with the PMOS transistor P10 and the NMOS transistor N(N+11) respectively via an inverter so as to control the PMOS transistor P10 and the NMOS transistor N(N+11) to turn on or off. After performing a mirror effect on the control current Iosc outputted from the decoding module by the PMOS transistor P7 and the PMOS transistor P9, a charging current for charging the capacitor C4 is generated. When the control chip is just powered on, a voltage across the capacitor C4 is zero, a low level is outputted from the comparator T(N+3), a high level is outputted from the comparator T(N+4), a high level is outputted from the RS trigger consisting of two NOR gates and then turned over to a low level by the inverter, the PMOS transistor P10 is turned on, the NMOS transistor N(N+11) is turned off, and a charging for the capacitor C4 is started. When the voltage across the capacitor C4 is larger than the reference voltage $V_{ref(N+3)}$, a high level is outputted from the comparator T(N+3), a low level is outputted from the RS trigger and then turned over to a high level by the inverter, the PMOS transistor P10 is turned off, the NMOS transistor N(N+11) is turned on, and a discharging for the capacitor C4 is started. The discharging current of the capacitor C4 is subtracted from the control current Iosc, on which a mirror effect is performed by the PMOS transistor P7, the PMOS transistor P8, the NMOS transistor N(N+9) and the NMOS transistor N(N+10) so as to generating a current in the second discharging circuit. The discharging is stopped until the voltage across the capacitor C4 is less than the reference voltage $V_{ref(N+4)}$. The above processes are repeated, thus outputting a square-wave signal from the RS trigger. The discharging or charging current of the capacitor C4 can be changed by changing the control current Iosc, and then the frequency of the square wave outputted from the RS trigger can be changed.

With the control chip according to another embodiment of the present disclosure, by providing the line voltage detecting module, the decoding module and the second oscillator module described above, the operational frequency of the switching power source can be decreased continuously when the amplitude of the alternating current increases.

The square-wave signal outputted from the RS trigger may be used directly as the control signal for the main switching transistor Q1, or may be transmitted to the mode control unit as the operational frequency of the control chip so as to generate the control signal for controlling the main switching transistor Q1 to turn on or off by the mode control unit.

It should be noted that, the MOS transistors used in the above embodiments are only exemplary, and cannot be understood as a limit to the present disclosure. When MOS transistors having the same parameters and opposite conduction types with respect to those MOS transistors used above are used, the sources and drains thereof can be connected in a reverse pattern to that shown in the drawings.

According to embodiments of the present disclosure, a method for controlling the switching power source is further provided and the method includes the following steps.

At step 1, the switching power source is powered on, and an amplitude of the alternating current is obtained from the direct current. The direct current may be inputted by the filtering and rectifying module or the primary constant current circuit.

At step 2, the frequency of a control signal is adjusted according to the amplitude of the alternating current and the control signal is output. The frequency of the control signal decreases continuously or intermittently when the amplitude of the alternating current increases.

In one embodiment of the present disclosure, the frequency of the control signal is adjusted continuously. Specifically, a continuously changing negative compensating current is firstly generated according to the amplitude of the alternating current. Then, a discharging or charging current negatively correlated with the negative compensating current is generated. Finally, a pulse signal with a frequency corresponding to the discharging or charging current is outputted. Thus, a continuous adjustment to the frequency of the control signal can be realized.

In another embodiment of the present disclosure, the frequency of the control signal is adjusted intermittently. Specifically, a positively correlated binary signal is firstly generated according to the amplitude of the alternating current. Then, the binary signal is decoded to form a negatively correlated and intermittently changing control current, and a discharging or charging current changing with the control current is generated. Finally, a pulse signal with a frequency corresponding to the discharging or charging current is outputted. Thus, a digital adjustment to the frequency of the control signal can be realized.

At step 3, the primary constant current circuit is controlled to output a constant current according to the control signal.

With the control method according to the present disclosure, when the amplitude of the alternating current increases, the operational frequency of the switching power source can be changed continuously or intermittently. Thus, the switching power source can be applied to both analog circuits and digital circuits.

According to embodiments of the present disclosure, when the amplitude of the alternating current is low, the control chip controls the switching power source to work in the CCM mode so as to obtain a smaller primary charging or discharging current and a higher operational frequency. Thus, even when a transformer with a small core area is used, an output power of the transformer can be equal to that of a transformer with a larger core area, and the transformer can be ensured not to enter a saturation state. Furthermore, as entering the CCM mode, a relatively high inductance can be designed, thus ensuring that the air gap between magnetic cores is not too large to cause a substantial iron loss.

When the amplitude of the alternating current is high, the control chip controls the switching power source to exit the CCM mode and to enter the DCM mode and decrease the operational frequency thereof. Thus, the switching loss of the switching transistor is reduced due to the fact that the switching loss of the switching transistor is in direct proportion to the operational frequency of the switching power source. Further, as the switching loss of the switching transistor is a main loss of the switching power source when the amplitude of the input alternating current is high, the loss of the system can be reduced greatly by reducing the operational frequency of the switching power source when the amplitude of the input alternating current is high.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A switching power source, comprising:
    a filtering and rectifying module, connected with an AC power source and configured to filter an alternating current outputted from the AC power source to obtain a filtered alternating current and to rectify the filtered alternating current into a direct current;
    a control module, connected with the filtering and rectifying module and configured to obtain an amplitude of the alternating current from the direct current, to adjust a frequency of a control signal output according to the amplitude of the alternating current, wherein the control module decreases the frequency of the control signal continuously or intermittently when the amplitude of the alternating current increases, and to output the control signal; and
    a primary constant current circuit, connected with the control module and the filtering and rectifying module respectively, and configured to receive the control signal and to output a constant current according to the control signal.

2. The switching power source according to claim 1, wherein the primary constant current circuit comprises:
    a main switching transistor, connected with the control module, in which the main switching transistor is turned on or off by the control signal;
    a primary winding, connected with the main switching transistor and the filtering and rectifying module respectively, and configured to convert the direct current into an electromagnetic signal;
    a secondary winding, configured to output a constant current according to the electromagnetic signal generated by the primary winding; and
    a feedback winding, connected with the control module and the filtering and rectifying module respectively, and configured to transmit the amplitude of the alternating current to the control module.

3. The switching power source according to claim 1 or 2, wherein the control module comprises:
    a negative compensating unit, connected with the feedback winding, and configured to receive the amplitude of the alternating current, and to generate a continuously changing negative compensating current according to the amplitude of the alternating current, in which an amplitude of the negative compensating current is positively correlated with the amplitude of the alternating current; and
    a first oscillator unit, connected with the negative compensating unit, and configured to receive the negative compensating current outputted from the negative compensating unit and to output a pulse signal according to the negative compensating current.

4. The switching power source according to claim 3, wherein the negative compensating unit comprises a first mirror current source and a first switching transistor, a first output end of the first mirror current source is connected with the first switching transistor, a gate of the first switching transistor is connected with a reference voltage, a source or a drain of the first switching transistor is connected with the feedback winding, and a negative compensating current is output to the first oscillator unit from a second output end of the first mirror current source when the first switching transistor is turned on.

5. The switching power source according to claim 3, wherein the first oscillator unit comprises a reference current source, a first capacitor, a first charging circuit, a first discharging circuit, a first charging switching transistor, a first discharging switching transistor and a first trigger, the first capacitor is connected with the reference current source and the negative compensating module respectively via the first charging circuit, the first capacitor is grounded via the first discharging circuit, the first trigger is connected with the first capacitor, the first charging switching transistor is configured to control the first charging circuit to turn on or off, the first discharging switching transistor is configured to control the first discharging circuit to turn on or off, a discharging or charging current of the first capacitor changes with a difference between the reference current and the negative compensating current, and the first trigger is configured to output the pulse signal with a frequency corresponding to the discharging or charging current of the first capacitor, in which the discharging and charging current of the first capacitor is negatively correlated with the negative compensating current.

6. The switching power source according to claim 1, wherein the control module comprises:
- a line voltage detecting unit, connected with the filtering and rectifying module, and configured to receive a direct current comprising the amplitude of the alternating current, and to generate a positively correlated binary signal according to the amplitude of the alternating current;
- a decoding unit, configured to decode the binary signal to form a negatively correlated and intermittently changing control current and to output the control current; and
- a second oscillator unit, configured to receive the control current and to output a pulse signal according to the control current.

7. The switching power source according to claim 6, wherein the line voltage detecting unit comprises N comparators, a positive terminal of each comparator is connected with the filtering and rectifying module, a negative terminal of an $m^{th}$ comparator is connected with an $m^{th}$ reference voltage, the $m^{th}$ reference voltage decreases or increases gradually with an increment of m, an output level of each comparator changes with the amplitude of the alternating current so as to generate a N-bit binary signal, in which an amplitude of the binary signal is positively correlated with the amplitude of the alternating current, N is a positive integer larger than 2, and m is an integer, $1 \leq m \leq N$.

8. The switching power source according to claim 7, wherein the decoding unit comprises a second mirror current source, N transistors connected in parallel, a first current source and N second current sources, a first output end of the second mirror current source is connected in parallel with the N transistors, a control terminal of an $m^{th}$ transistor is connected with an output terminal of the $m^{th}$ comparator, a drain of each transistor is connected with the first current source, and a source of the $m^{th}$ transistor is grounded via an $m^{th}$ second current source, the N transistors are turned on or off under a control of the N-bit binary signal, a first output end of the second mirror current source outputs a current negatively correlated with the N-bit binary signal, and a second output end of the second mirror current source outputs a control current to the second oscillator unit, in which the current outputted from the first output end of the second mirror current source is the same as the control current outputted from the second output end of the second mirror current source.

9. The switching power source according to claim 6, wherein the second oscillator unit comprises a second capacitor, a second charging circuit, a second discharging circuit, a second charging switching transistor, a second discharging switching transistor and a second trigger, the second capacitor is connected with the control current via the second charging circuit, the second capacitor is grounded via the second discharging circuit, the second trigger is connected with the second capacitor, the second charging switching transistor is configured to control the second charging circuit to turn on or off, the second discharging switching transistor is configured to control the second discharging circuit to turn on or off, a discharging or charging current of the second capacitor changes with the control current, and the second trigger is configured to output a pulse signal with a frequency corresponding to the discharging or charging current of the second capacitor.

10. A method for controlling a switching power source including a filtering and rectifying module, connected with an AC power source and configured to filter an alternating current outputted from the AC power source to obtain a filtered alternating current and to rectify the filtered alternating current into a direct current; and a primary constant current circuit, connected with the filtering and rectifying module, the method comprising:
- powering on the switching power source;
- obtaining an amplitude of the alternating current from the direct current;
- adjusting a frequency of a control signal according to the amplitude of the alternating current and outputting the control signal, in which the frequency of the control signal decreases continuously or intermittently when the amplitude of the alternating current increases; and
- controlling the primary constant current circuit to output a constant current according to the control signal.

11. The method according to claim 10, wherein adjusting a frequency of a control signal according to the amplitude of the alternating current comprises:
- generating a continuously changing negative compensating current according to the amplitude of the alternating current;
- generating a discharging or charging current negatively correlated with the negative compensating current; and
- outputting a pulse signal with a frequency corresponding to the discharging or charging current.

12. The method according to claim 10, wherein adjusting a frequency of a control signal according to the amplitude of the alternating current comprises:
- generating a positively correlated binary signal according to the amplitude of the alternating current;
- decoding the binary signal to form a negatively correlated and intermittently changing control current;
- generating a discharging or charging current changing with the control current; and
- outputting a pulse signal with a frequency corresponding to the discharging or charging current.

13. A control chip for controlling a switching power source including a filtering and rectifying module and a primary constant current circuit, the filtering and rectifying module being connected with an AC power source and configured to filter an alternating current outputted from the AC power source to obtain a filtered alternating current and to rectify the filtered alternating current into a direct current, the primary constant current circuit being connected with the filtering and rectifying module, the control chip comprising:
- a negative compensating module, connected with the primary constant current circuit and the filtering and rectifying module respectively, and configured to obtain an amplitude of the alternating current from the direct current, and to generate a continuously changing negative compensating current according to the amplitude of the alternating current, in which an amplitude of the negative compensating current is positively correlated with the amplitude of the alternating current; and
- a first oscillator module, connected with the negative compensating module, and configured to receive the negative compensating current outputted from the negative compensating module and to output a pulse signal according to the negative compensating current.

14. The control chip according to claim 13, wherein the negative compensating module comprises a first mirror current source and a first switching transistor, a first output end of the first mirror current source is connected with the first switching transistor, a gate of the first switching transistor is connected with a reference voltage, a source or a drain of the first switching transistor is connected with the feedback winding, and a negative compensating current is output to the first oscillator module from a second output end of the first mirror current source when the first switching transistor is turned on.

15. The control chip according to claim 13, wherein the first oscillator module comprises a reference current source, a first capacitor, a first charging circuit, a first discharging circuit, a first charging switching transistor, a first discharging switching transistor and a first trigger, the first capacitor is connected with the reference current source and the negative compensating module respectively via the first charging circuit, the first capacitor is grounded via the first discharging circuit, the first trigger is connected with the first capacitor, the first charging switching transistor is configured to control the first charging circuit to turn on or off, the first discharging switching transistor is configured to control the first discharging circuit to turn on or off, a discharging or charging current of the first capacitor changes with a difference between the reference current and the negative compensating current, and the first trigger is configured to output the pulse signal with a frequency corresponding to the discharging or charging current of the first capacitor, in which the discharging and charging current of the first capacitor is negatively correlated with the negative compensating current.

16. A control chip for controlling a switching power source including a filtering and rectifying module and a primary constant current circuit, the filtering and rectifying module being connected with an AC power source and configured to filter an alternating current outputted from the AC power source to obtain a filtered alternating current and to rectify the filtered alternating current into a direct current, the primary constant current circuit being connected with the filtering and rectifying module, and the control chip comprising:
a line voltage detecting module, connected with the filtering and rectifying module, and configured to receive a direct current comprising the amplitude of the alternating current, and to generate a positively correlated binary signal according to the amplitude of the alternating current;
a decoding module, configured to decode the binary signal to form a negatively correlated and intermittently changing control current and to output the control current; and
a second oscillator module, configured to receive the control current and to output a pulse signal according to the control current.

17. The control chip according to claim 16, wherein the line voltage detecting module comprises N comparators, a positive terminal of each comparator is connected with the filtering and rectifying module, a negative terminal of an $m^{th}$ comparator is connected with an $m^{th}$ reference voltage, the $m^{th}$ reference voltage decreases or increases gradually with an increment of m, an output level of each comparator changes with the amplitude of the alternating current so as to generate a N-bit binary signal, in which an amplitude of the binary signal is positively correlated with the amplitude of the alternating current, N is a positive integer larger than 2, and m is an integer, $1 \leq m \leq N$.

18. The control chip according to claim 17, wherein the detecting module comprises a second mirror current source, N transistors connected in parallel, a first current source and N second current sources, a first output end of the second mirror current source is connected in parallel with the N transistors, a control terminal of an $m^{th}$ transistor is connected with an output terminal of the $m^{th}$ comparator, a drain of each transistor is connected with the first current source, and a source of the $m^{th}$ transistor is grounded via an $m^{th}$ second current source, the N transistors are turned on or off under a control of the N-bit binary signal, a first output end of the second mirror current source outputs a current negatively correlated with the N-bit binary signal, and a second output end of the second mirror current source outputs a control current to the second oscillator unit, in which the current outputted from the first output end of the second mirror current source is the same as the control current outputted from the second output end of the second mirror current source.

19. The control chip according to claim 16, wherein the second oscillator module comprises a second capacitor, a second charging circuit, a second discharging circuit, a second charging switching transistor, a second discharging switching transistor and a second trigger, the second capacitor is connected with the control current via the second charging circuit, the second capacitor is grounded via the second discharging circuit, the second trigger is connected with the second capacitor, the second charging switching transistor is configured to control the second charging circuit to turn on or off, the second discharging switching transistor is configured to control the second discharging circuit to turn on or off, a discharging or charging current of the second capacitor changes with the control current, and the second trigger is configured to output a pulse signal with a frequency corresponding to the discharging or charging current of the second capacitor.

* * * * *